(12) United States Patent
Karalkar et al.

(10) Patent No.: US 12,471,386 B2
(45) Date of Patent: Nov. 11, 2025

(54) ELECTROSTATIC DISCHARGE PROTECTION DEVICES

(71) Applicant: GlobalFoundries U.S. Inc., Malta, NY (US)

(72) Inventors: Sagar Premnath Karalkar, Essex Junction, VT (US); Ephrem Gebreselasie, South Burlington, VT (US); Rajendran Krishnasamy, Essex Junction, VT (US); Robert J. Gauthier, Jr., Williston, VT (US); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 467 days.

(21) Appl. No.: 18/086,938

(22) Filed: Dec. 22, 2022

(65) Prior Publication Data

US 2024/0213240 A1 Jun. 27, 2024

(51) Int. Cl.
*H10D 89/60* (2025.01)
*H01L 21/762* (2006.01)
*H01L 23/60* (2006.01)
*H10D 84/03* (2025.01)

(52) U.S. Cl.
CPC ..... *H10D 89/713* (2025.01); *H01L 21/76224* (2013.01)

(58) Field of Classification Search
CPC ...... H10D 89/713; H10D 89/60; H01L 23/60; H01L 21/76224
See application file for complete search history.

(56) References Cited

U.S. PATENT DOCUMENTS

| 6,011,681 A | 1/2000 | Ker et al. |
| 6,920,026 B2 | 7/2005 | Chen et al. |
| 6,960,792 B1 | 11/2005 | Nguyen |
| 7,601,991 B2 | 10/2009 | Salcedo et al. |
| 8,169,760 B2 | 5/2012 | Chang et al. |
| 8,860,080 B2 | 10/2014 | Salcedo |
| 9,029,206 B2 | 5/2015 | Gauthier, Jr. et al. |
| 2006/0145260 A1 | 7/2006 | Kim |
| 2017/0018612 A1* | 1/2017 | Ito .................... H01L 21/283 |

(Continued)

OTHER PUBLICATIONS

G. Boselli and M. Y. Ali, "A novel, SCR-based, distributed power supply ESD network for advanced CMOS technologies," 2017 39th Electrical Overstress/Electrostatic Discharge Symposium (EOS/ESD), 2017, pp. 1-8, doi: 10.23919/EOSESD.2017.8073456.

(Continued)

*Primary Examiner* — Sonya McCall-Shepard
(74) *Attorney, Agent, or Firm* — Thompson Hine LLP; Francois Pagette

(57) ABSTRACT

Structures for an electrostatic discharge protection device and methods of forming same. The structure comprises a first well and a second well in the semiconductor substrate. The first and second wells have a first conductivity type. The structure further comprises a third well and a fourth well in the semiconductor substrate. The third and fourth wells have a second conductivity type, the third well includes a portion that overlaps with the first well, and the fourth well includes a portion that overlaps with the second well.

20 Claims, 3 Drawing Sheets

(56) References Cited

U.S. PATENT DOCUMENTS

2021/0020625 A1* 1/2021 Lin .................... H10D 8/80

OTHER PUBLICATIONS

Ming-Dou Ker and Hsin-Chin Jiang, "Whole-chip ESD protection strategy for CMOS integrated circuits in nanotechnology," Proceedings of the 2001 1st IEEE Conference on Nanotechnology. IEEE-NANO 2001 (Cat. No. 01EX516), 2001, pp. 325-330, doi: 10.1109/NANO.2001.966442.

Ming-Dou Ker and K. .-C. Hsu, "Overview of on-chip electrostatic discharge protection design with SCR-based devices in CMOS integrated circuits," in IEEE Transactions on Device and Materials Reliability, vol. 5, No. 2, pp. 235-249, Jun. 2005, doi: 10.1109/TDMR.2005.846824.

European Patent Office, Extended European Search Report and Opinion issued in European Patent Application No. 23198265.3 on Mar. 18, 2024; 7 pages.

* cited by examiner

ELECTROSTATIC DISCHARGE
PROTECTION DEVICES

BACKGROUND

The disclosure relates generally to semiconductor devices and integrated circuit fabrication and, more specifically, to structures for an electrostatic discharge protection device and methods of forming same.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed toward the integrated circuit. ESD events may occur during post-manufacture chip handling or after chip installation on a circuit board or other carrier. ESD events may originate from a variety of sources, such as the human body, a machine component, or a chip carrier.

Precautions may be taken to protect the integrated circuit from an ESD event. One such precaution is an on-chip protection circuit that is designed to avert damage to the sensitive devices of the integrated circuit during an ESD event. If an ESD event occurs, the protection circuit triggers a protection device to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

Improved structures for an electrostatic discharge protection device and methods of forming same are needed.

SUMMARY

In an embodiment, a structure for an electrostatic discharge protection device is provided. The structure comprises a first well and a second well in the semiconductor substrate. The first well and the second well have a first conductivity type. The structure further comprises a third well and a fourth well in the semiconductor substrate. The third well and the fourth well have a second conductivity type, the third well includes a portion that overlaps with the first well, and the fourth well includes a portion that overlaps with the second well.

In an embodiment, a method of forming a structure for an electrostatic discharge protection device is provided. The method comprises forming a first well and a second well in the semiconductor substrate. The first well and the second well have a first conductivity type. The method further comprises forming a third well and a fourth well in the semiconductor substrate. The third well and the fourth well have a second conductivity type, the third well includes a portion that overlaps with the first well, and the fourth well includes a portion that overlaps with the second well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
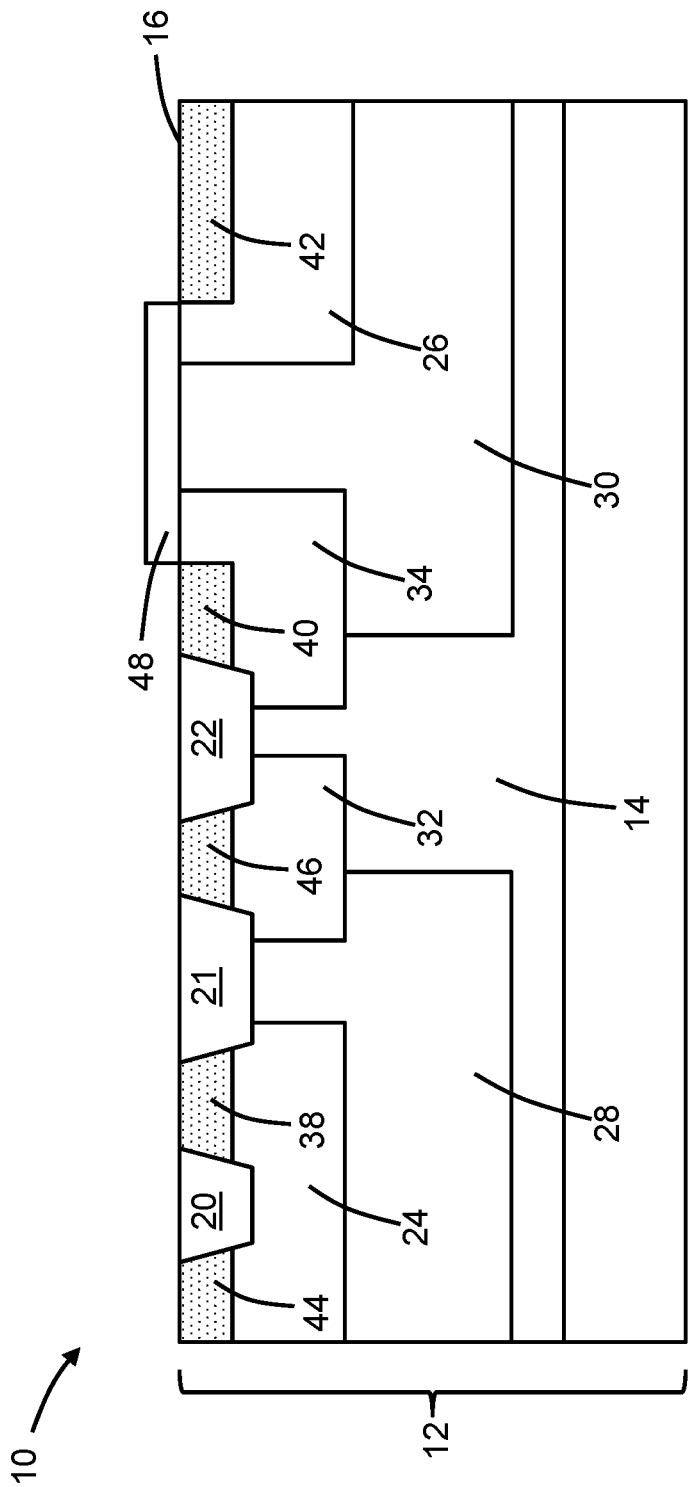
FIG. 1 is a cross-sectional view of a structure in accordance with embodiments of the invention.

With reference to FIG. 1 and in accordance with embodiments of the invention, a device structure 10 for an electrostatic discharge protection device includes a semiconductor substrate 12, a deep well 14, and shallow trench isolation regions 20, 21, 22. The semiconductor substrate 12 may be comprised of a semiconductor material, such as single-crystal silicon, that is doped to have p-type conductivity. The deep well 14 is doped to have an opposite conductivity type from the semiconductor substrate 12. In an embodiment, the deep well 14 may contain a concentration of an n-type dopant (e.g., arsenic or phosphorus) such that the deep well 14 has n-type conductivity. In an embodiment, the deep well 14 may be formed by introducing a dopant by, for example, a masked ion implantation into the semiconductor substrate 12. The implantation conditions (e.g., ion species, dose, kinetic energy) may be selected to tune the electrical and physical characteristics of the deep well 14. The shallow trench isolation regions 20, 21, 22 may be formed by patterning shallow trenches in the semiconductor substrate 12 with lithography and etching processes, depositing a dielectric material, such as silicon dioxide, in the shallow trenches, and planarizing and/or recessing the deposited dielectric material.

Wells 24, 26 and wells 28, 30 may be formed in the semiconductor substrate 12. A portion of the deep well 14 is positioned in a lateral direction as a finger of oppositely-doped semiconductor material between the well 24 and the well 26. The finger portion of the deep well 14 may extend in a vertical direction between the well 28 and the well 30. The well 28 may be positioned in a vertical direction between the well 24 and a top surface 16 of the semiconductor substrate 12. Similarly, the well 30 may be positioned in a vertical direction between the well 26 and the top surface 16 of the semiconductor substrate 12. The deep well 14 includes a portion positioned in a vertical direction between the well 28 and the semiconductor substrate 12 beneath the deep well 14. The deep well 14 also includes another portion positioned in a vertical direction between the well 30 and the semiconductor substrate 12 beneath the deep well 14. As a result, a single deep well 14 electrically isolates the wells 28, 30 from the semiconductor substrate 12 beneath the deep well 14 and eliminates the need for an extra guard ring.

In an embodiment, the wells 24, 26 and the wells 28, 30 may contain a concentration of a p-type dopant (e.g., boron) to provide p-type conductivity. The wells 24, 26 may have a higher dopant concentration than the wells 28, 30. The wells 24, 26 may be formed by selectively implanting ions, such as ions including the p-type dopant, with an implantation mask having openings defining the intended locations for the wells 24, 26 in the semiconductor substrate 12. The implantation conditions (e.g., ion species, dose, kinetic energy) may be selected to tune the electrical and physical characteristics of the wells 24, 26. The wells 28, 30 may be formed by selectively implanting ions, such as ions including the p-type dopant, with an implantation mask having openings defining the intended locations for the wells 28, 30 in the semiconductor substrate 12. The implantation conditions (e.g., ion species, dose, kinetic energy) may be selected to tune the electrical and physical characteristics of the wells 28, 30.

Wells 32, 34 may be formed in the semiconductor substrate 12. The well 32 includes a portion that overlaps with the finger portion of the deep well 14 and a portion that overlaps with the oppositely-doped well 28. The well 34 includes a portion that overlaps with the finger portion of the deep well 14 and a portion that overlaps with the oppositely-doped well 28. The shallow trench isolation region 22 and the finger portion of the deep well 14 are positioned in a lateral direction between the well 32 and the well 34. A finger portion of the well 28 and the shallow trench isolation region 21 are disposed in a lateral direction between the well 32 and the oppositely-doped well 24. A finger portion of the well 30 is disposed in a lateral direction between the well 34 and the oppositely-doped well 26.

The wells 32, 34 have the same conductivity type as the deep well 14 and an opposite conductivity type from the wells 28, 30. In an embodiment, the wells 32, 34 may contain a concentration of an n-type dopant (e.g., arsenic or phosphorus) to provide n-type conductivity. In an embodiment, the wells 32, 34 may have a higher dopant concentration than the deep well 14. The wells 32, 34 may be concurrently formed by selectively implanting ions, such as ions including the n-type dopant, with an implantation mask having openings defining the intended locations for the wells 32, 34 in the semiconductor substrate 12. The implantation conditions (e.g., ion species, dose, kinetic energy) may be selected to tune the electrical and physical characteristics of the wells 32, 34.

A doped region 38 is positioned in the well 24, a doped region 40 is positioned in the well 34, and a doped region 42 is positioned in the well 26. The doped region 38, 40, 42 are located adjacent to the top surface 16 of the semiconductor substrate 12. The doped region 38 and the doped region 42 may be doped to the same conductivity type as the wells 24, 26 but at a higher dopant concentration, and the doped region 40 may be doped to have an opposite conductivity type from the well 34. In an embodiment, the doped regions 38, 40, 42 may contain a concentration of a p-type dopant (e.g., boron) to provide p-type conductivity. The doped regions 38, 40, 42 may be concurrently formed by selectively implanting ions, such as ions including the p-type dopant, with an implantation mask having openings defining the intended locations for the doped regions 38, 40, 42 in the semiconductor substrate 12. The implantation conditions (e.g., ion species, dose, kinetic energy) may be selected to tune the electrical and physical characteristics of the doped regions 38, 40, 42.

A doped region 44 is positioned in the well 24, and a doped region 46 is positioned in the well 32. The doped regions 44, 46 are located adjacent to the top surface 16 of the semiconductor substrate 12. The doped region 44 may be doped to have an opposite conductivity type from the well 24, and the doped region 46 may be doped to have the same conductivity type as the well 32 but at a higher dopant concentration. In an embodiment, the doped regions 44, 46 may contain a concentration of an n-type dopant (e.g., phosphorus or arsenic) to provide n-type conductivity. The doped regions 44, 46 may be concurrently formed by selectively implanting ions, such as ions including the n-type dopant, with an implantation mask having openings defining the intended locations for the doped regions 44, 46 in the semiconductor substrate 12. The implantation conditions (e.g., ion species, dose, kinetic energy) may be selected to tune the electrical and physical characteristics of the doped regions 44, 46. The shallow trench isolation region 20 is positioned between the doped region 38 and the doped region 44. The shallow trench isolation region 21 is positioned between the doped region 38 and the doped region 46. The shallow trench isolation region 22 is positioned between the doped region 40 and the doped region 46.

The shallow trench isolation region 20 is positioned in a lateral direction between the doped region 38 and the doped region 44, which are positioned adjacent to each other. The shallow trench isolation region 21 is positioned in a lateral direction between the doped region 38 and the doped region 46, which are positioned adjacent to each other. The shallow trench isolation region 22 is positioned in a lateral direction between the doped region 46 and the doped region 40, which are positioned adjacent to each other.

A dielectric layer 48 may be formed on the top surface 16 of the semiconductor substrate 12. The dielectric layer 48 may be comprised of a dielectric material, such as silicon nitride, that is deposited and then patterned by lithography and etching processes to form the sections. The dielectric layer 48 has an overlapping relationship with a portion of the well 26, a portion of the well 34, and the finger portion of the well 30 that is disposed in a lateral direction between the portion of the well 26 and the portion of the well 34. In an alternative embodiment, the dielectric layer 48 may also overlap with all or a portion of the doped region 40 and with all or a portion of the doped region 42. The dielectric layer 48 may function as a silicide-blocking layer.

Figure 2:
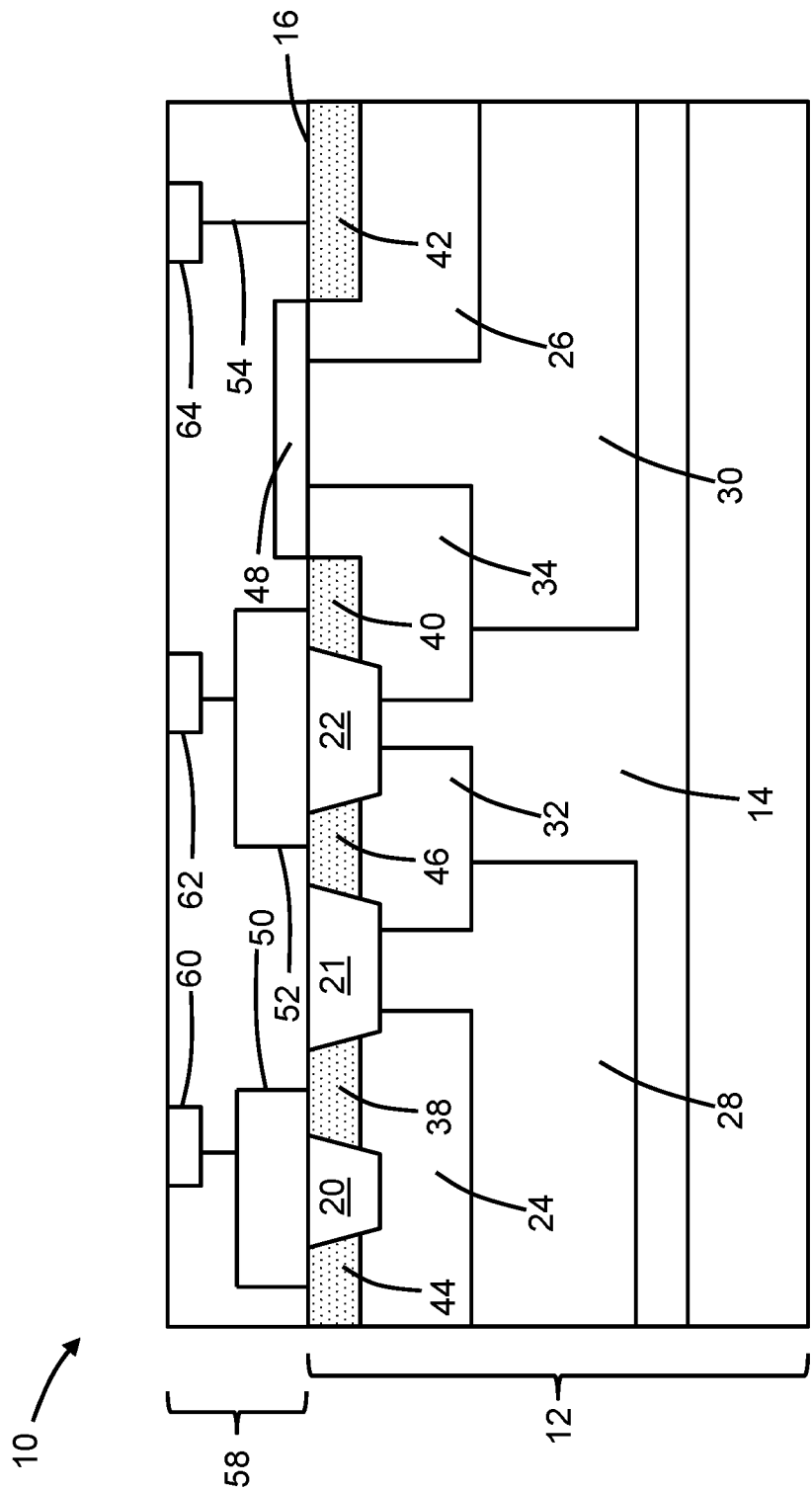
FIG. 2 is a cross-sectional view of the structure at a fabrication stage subsequent to FIG. 1.

With reference to FIG. 2 in which like reference numerals refer to like features in FIG. 1 and at a subsequent fabrication stage, the device structure 10 may include an interconnect structure 58 formed by middle-of-line processing and back-end-of-line processing. The interconnect structure 58 may include electrical connections 50, 52, 54 that are coupled to the electrostatic discharge protection device. The electrical connections 50, 52, 54 may include metal features that are disposed in one or more dielectric layers of the interconnect structure 58.

The electrical connection 50 physically and electrically connects the doped region 38 and the doped region 44, which are adjacent to each other, to a ground terminal 60. The electrical connection 52 physically and electrically connects the doped region 40 and the doped region 46, which are adjacent to each other, to an input/output terminal 62 that is protected by the device structure 10. In an embodiment, the input/output terminal 62 may be a power pad. The electrical connection 54 physically and electrically connects to the doped region 42 to a power (Vdd) terminal 64. The well 28 is coupled to the ground terminal 60 by the well 24 and doped region 38, and the well 30 is coupled to the power terminal 64 by the well 26 and the doped region 42.

The device structure 10 may improve electrostatic discharge protection for the input/output terminal 62. The well 32, which is connected to the input/output terminal 62, includes a portion that overlaps with the well 28 of opposite conductivity type and a portion that overlaps with the finger portion of the deep well 14 of the same conductivity type. The well 34 includes a portion that overlaps with the well 30 of opposite conductivity type and a portion that overlaps with the finger portion of the deep well 14 of the same conductivity type. The doped region 38, which is connected to the ground terminal 60, is positioned adjacent to the doped region 46 that is connected to the input/output terminal 62. The doped region 44, the wells 24, 28, and the well 32 define an NPN parasitic transistor, the doped region 40, the well 34, and the wells 26, 30 define a PNP parasitic transistor, and the doped region 44, the doped region 38, the doped region 46, deep well 14, and the doped region 42 define a silicon-controlled rectifier device structure that is integrated with the NPN parasitic transistor and the PNP parasitic transistor. The silicon-controlled rectifier device structure of the electrostatic discharge protection device provides a local clamp between the ground terminal 60 and the power terminal 64.

Figure 3:
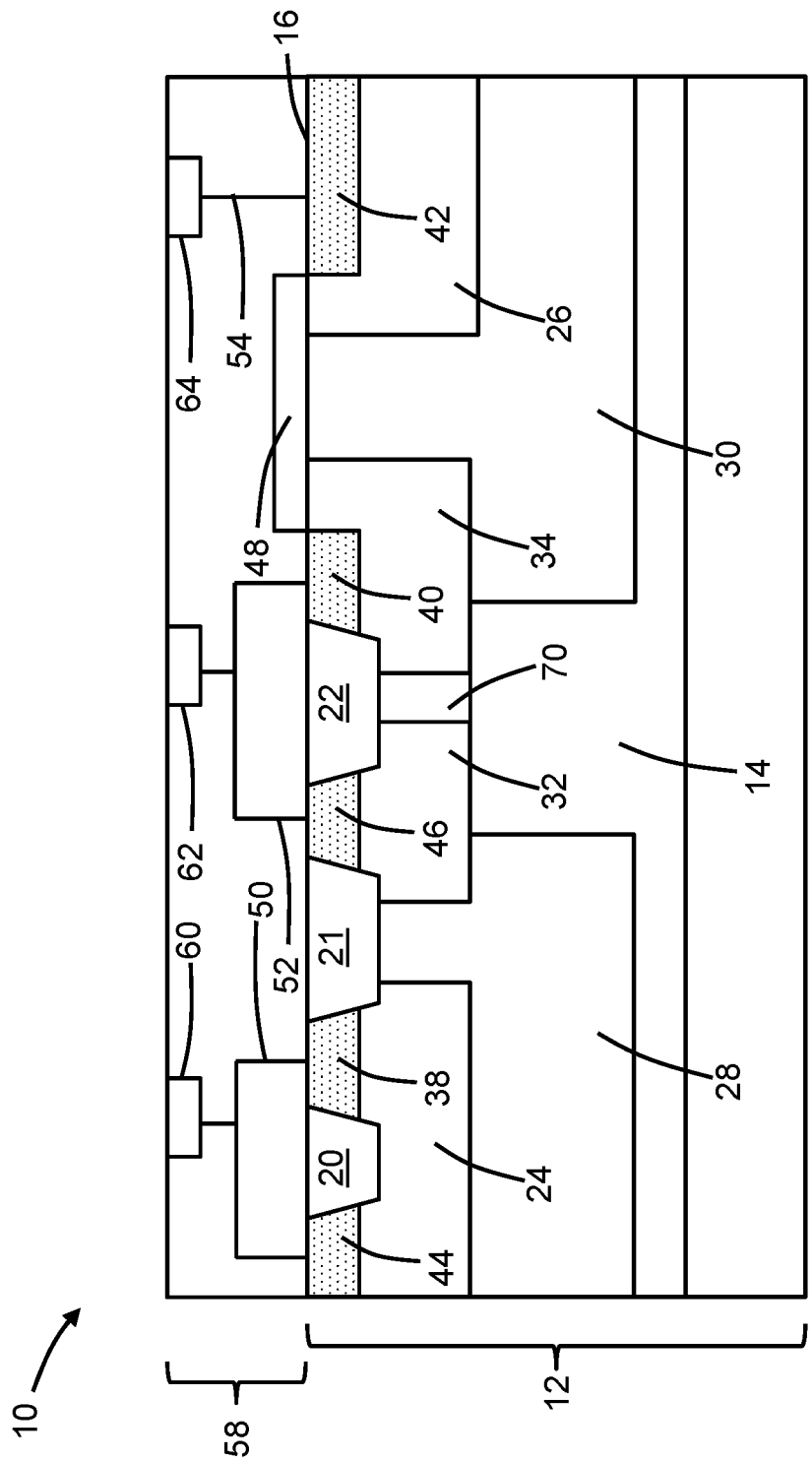
FIG. 3 is a cross-sectional view of a structure in accordance with alternative embodiments of the invention.

With reference to FIG. 3 in which like reference numerals refer to like features in FIG. 2 and in accordance with alternative embodiments of the invention, the device structure 10 may be modified to add a well 70 beneath the shallow trench isolation region 22. The well 70 may be doped to have an opposite conductivity type from the wells 32, 34 and an opposite conductivity type from the deep well 14. The well 70 is positioned in a lateral direction between the well 32 and the well 34, and the well 70 is positioned in a vertical direction between the finger portion of the deep well 14 and the shallow trench isolation region 22. The well 70 is electrically isolated and floating in the device structure 10. In an embodiment, the well 70 may be formed when the wells 24, 26 are formed and may have the same conductivity type (e.g., p-type conductivity) as the wells 24, 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an electrostatic discharge protection device, the structure comprising:
    a semiconductor substrate;
    an input/output terminal;
    a first well in the semiconductor substrate, the first well having a first conductivity type;
    a second well in the semiconductor substrate, the second well having the first conductivity type;
    a third well in the semiconductor substrate, the third well having a second conductivity type, and the third well including a portion that overlaps with the first well;
    a fourth well in the semiconductor substrate, the fourth well having the second conductivity type, and the fourth well including a portion that overlaps with the second well; and
    a first doped region in the third well, the first doped region having the second conductivity type at a higher dopant concentration than the third well, and the first doped region connected to the input/output terminal.

2. The structure of claim 1 wherein the first conductivity type is p-type, and the second conductivity type is n-type.

3. The structure of claim 1 further comprising:
    a power terminal,
    wherein the first well is connected to the power terminal.

4. The structure of claim 1 further comprising:
    a ground terminal,
    wherein the second well is connected to the ground terminal.

5. The structure of claim 1 further comprising:
    a ground terminal; and
    a second doped region coupling the first well to the ground terminal, the second doped region having the first conductivity type at a higher dopant concentration than the first well, and the second doped region positioned adjacent to the first doped region.

6. The structure of claim 5 further comprising:
    a shallow trench isolation region in the semiconductor substrate, the shallow trench isolation region arranged in a lateral direction between the first doped region and the second doped region.

7. The structure of claim 5 further comprising:
    a third doped region in the fourth well, the third doped region having the first conductivity type, the third doped region positioned adjacent to the first doped region, and the third doped region connected to the input/output terminal.

8. The structure of claim 5 further comprising:
    a third doped region adjacent to the second doped region, the third doped region having the second conductivity type, and the third doped region connected to the ground terminal.

9. The structure of claim 5 further comprising:
a power terminal; and
a third doped region coupling the second well to the power terminal, the third doped region having the first conductivity type.

10. The structure of claim 1 further comprising:
a second doped region in the fourth well, the second doped region having the first conductivity type, the second doped region positioned adjacent to the first doped region, and the second doped region connected to the input/output terminal.

11. The structure of claim 1 further comprising:
a fifth well in the semiconductor substrate, the fifth well having the second conductivity type, and the fifth well including a first portion positioned between the first well and the second well.

12. The structure of claim 11 wherein the third well and the fourth well contain a higher dopant concentration than the fifth well.

13. The structure of claim 11 wherein the portion of the fifth well includes a second portion positioned between the third well and the fourth well.

14. The structure of claim 13 further comprising:
a shallow trench isolation region in the semiconductor substrate, the shallow trench isolation region positioned over the second portion of the fifth well.

15. A structure for an electrostatic discharge protection device, the structure comprising:
a semiconductor substrate having a top surface;
a first well in the semiconductor substrate, the first well having a first conductivity type;
a second well in the semiconductor substrate, the second well having the first conductivity type;
a third well in the semiconductor substrate, the third well having a second conductivity type, and the third well including a portion that overlaps with the first well;
a fourth well in the semiconductor substrate, the fourth well having the second conductivity type, and the fourth well including a portion that overlaps with the second well; and
a fifth well in the semiconductor substrate, the fifth well having the second conductivity type, the first well positioned in a vertical direction between a first portion of the fifth well and the top surface of the semiconductor substrate, and the second well positioned in the vertical direction between a second portion of the fifth well and the top surface of the semiconductor substrate.

16. The structure of claim 15 wherein the fifth well includes a third portion positioned in a lateral direction between the first well and the second well.

17. The structure of claim 1 further comprising:
a fifth well in the semiconductor substrate, the fifth well having the first conductivity type, and the fifth well positioned between the third well and the fourth well.

18. The structure of claim 17 wherein the semiconductor substrate has a top surface, and further comprising:
a shallow trench isolation region in the semiconductor substrate, the shallow trench isolation region positioned between the fifth well and the top surface of the semiconductor substrate.

19. A method of forming a structure for an electrostatic discharge protection device, the method comprising:
forming a first well and a second well in a semiconductor substrate, wherein the first well and the second well have a first conductivity type; forming a third well and a fourth well in the semiconductor substrate, wherein the third well and the fourth well have a second conductivity type, the third well includes a portion that overlaps with the first well, and the fourth well includes a portion that overlaps with the second well; and
forming a doped region in the third well, wherein the doped region having the second conductivity type at a higher dopant concentration than the third well, and the doped region is connected to an input/output terminal.

20. The structure of claim 1 wherein the semiconductor substrate has a top surface, and further comprising:
a fifth well in the semiconductor substrate, the fifth well having the second conductivity type, the first well positioned in a vertical direction between a first portion of the fifth well and the top surface of the semiconductor substrate, the second well positioned in the vertical direction between a second portion of the fifth well and the top surface of the semiconductor substrate, and the fifth well including a third portion positioned in a lateral direction between the first well and the second well.

* * * * *